US005656525A

United States Patent [19]

Lin et al.

[11] Patent Number: 5,656,525

[45] Date of Patent: Aug. 12, 1997

[54] METHOD OF MANUFACTURING HIGH ASPECT-RATIO FIELD EMITTERS FOR FLAT PANEL DISPLAYS

[75] Inventors: Ching-Yuan Lin, Chin-Chu; Peng Chao-Chi, Chinchu; Kyan-Lun Chang, Feng Yuan; Jermmy J. M. Wang, Kao-hsyung, all of Taiwan

[73] Assignee: Industrial Technology Research Institute, Hsin-Chu, Taiwan

[21] Appl. No.: 354,462

[22] Filed: Dec. 12, 1994

[51] Int. Cl.$^{6}$ .................................................. H01L 21/70

[52] U.S. Cl. .............................. 216/11; 445/50; 216/40; 438/20; 438/951

[58] Field of Search .......................... 437/51, 228, 203; 148/DIG. 100; 445/49, 50; 156/644, 659.1

[56] References Cited

U.S. PATENT DOCUMENTS

| | | | |
|---|---|---|---|
| 5,064,396 | 11/1991 | Spindt | 445/50 |
| 5,075,591 | 12/1991 | Holmberg | 313/495 |
| 5,229,331 | 7/1993 | Doan et al. | 437/228 |
| 5,249,340 | 10/1993 | Kane et al. | 437/203 |
| 5,342,737 | 8/1994 | Georger, Jr. et al. | 437/17 |
| 5,393,647 | 2/1995 | Neukermans et al. | 437/244 |
| 5,451,175 | 9/1995 | Smith et al. | 437/228 |
| 5,480,843 | 1/1996 | Park et al. | 437/228 |

*Primary Examiner*—Tuan H. Nguyen
*Attorney, Agent, or Firm*—George O. Saile

[57] ABSTRACT

A new method for forming an array of high aspect ratio field emitter for flat panel Field Emission Displays (FEDs) was accomplished. The method involves forming on an insulated substrate an array of parallel cathodes and then depositing a dielectric layer and forming a array of parallel gate electrodes essentially orthogonal to the array of cathode electrodes. Opening are then made in the upper gate electrodes and dielectric layer over the lower cathode electrodes. The field emitters with high aspect-ratios are then formed on the cathode by depositing an emitter material, such as molybdenum, in the opening while heating the substrate to high temperatures. The emitter material is removed elsewhere on the substrate by utilizing a release layer and thereby completing the gated field emitter. This high temperature method results in high aspect-ratio gated emitters that allow the inter-electrode dielectric layer to be increased and thereby improving the circuit performance.

32 Claims, 5 Drawing Sheets

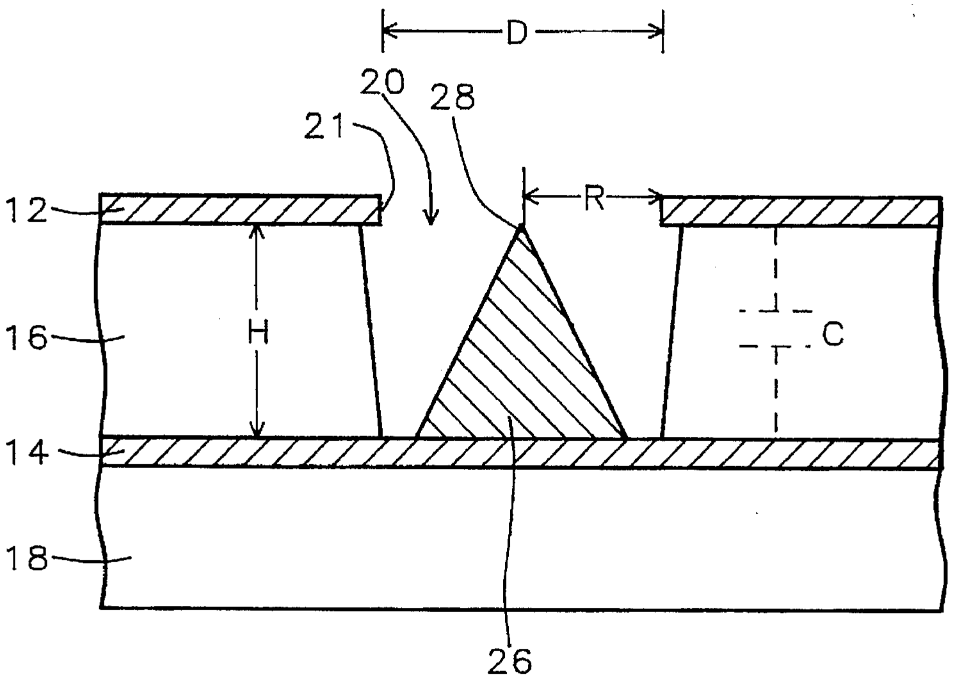
FIG. 1 – Prior Art
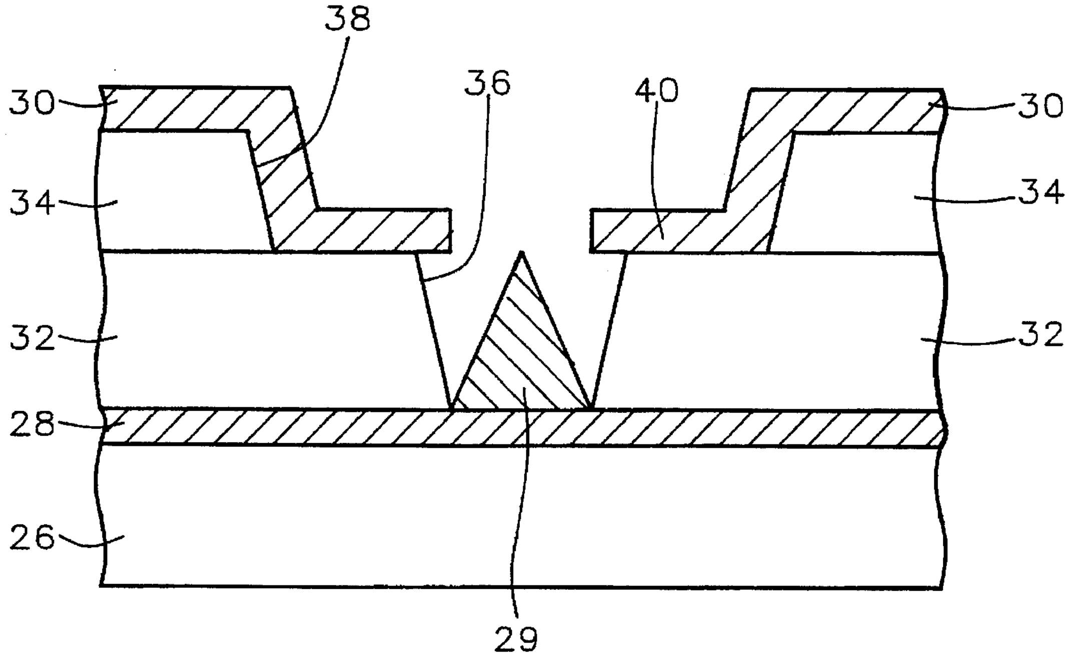
FIG. 2 – Prior Art

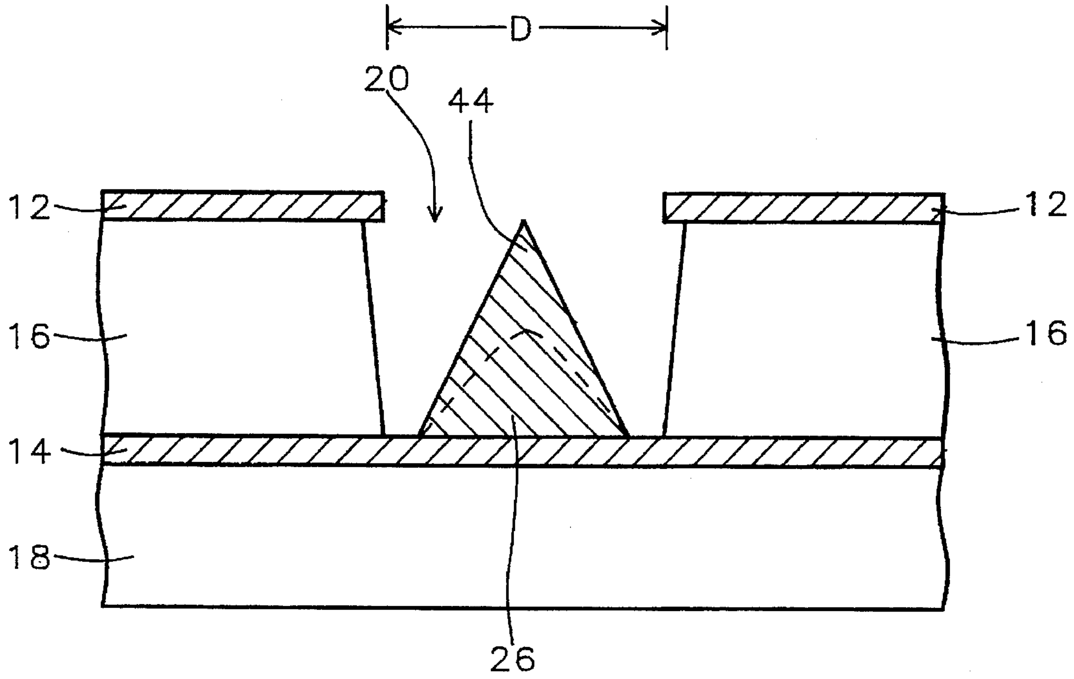
*FIG. 3 – Prior Art*
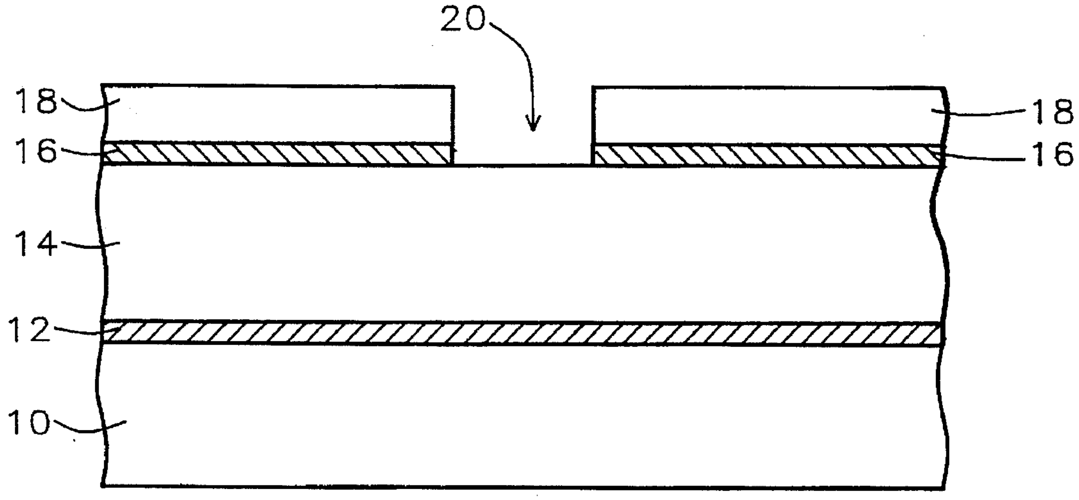
*FIG. 4*

METHOD OF MANUFACTURING HIGH ASPECT-RATIO FIELD EMITTERS FOR FLAT PANEL DISPLAYS

BACKGROUND OF THE INVENTION (1) Field of the Invention

The present invention relates to flat panel Field Emission Displays (FEDs), and more particularly, to a method for manufacturing an array of micro-miniature field emission cathode structures having high aspect ratios and improved electrical characteristics.

(2) Description of the Prior Art

There is a strong need in the electronics industry to replace the traditional cathode ray tube (CRT) with thin, lightweight display panels. For example, one application for low power, low cost flat panel displays (FPD) is in the computer industry for portable computers, such as laptop computers. The most commonly used display panel, at the current time, is the liquid crystal display (LCD) because of its' relatively low cost and power consumption. However, because of the slow optical response time of the liquid crystal to turn on or off a pixel (the discrete dots on the screen making up the image) and because of the relatively poor luminosity, for example, as measured in foot-Lamberts, other display technologies are actively being explored.

One alternative display technology having the potential to satisfy the required faster response times and increased brightness are flat panel Field Emission Displays (FEDs). The flat panel FED can be considered as an array of micro-miniature cold cathode electron emitters mounted on a substrate or backing plate from which emitted electrons are accelerated across the thickness of the evacuated panel to excite an electroluminescent material (phosphors) comprising the pixels (dots) on a transparent plate that serves as both the anode and the viewing screen. The array of very small conical shaped electron emitters are electrically accessed, for peripheral control and image forming circuits, by an array of conducting lines that form columns and rows. The columns lines form the cathode contact on which the conical electron emitters are formed. The rows of conducting lines are separated by an insulating layer from the column lines, formed on the backing plate, and both the row conducting lines and the insulator have opening over the column lines on which the electron emitter is then formed. The row lines having the edge of the openings in close proximity to the emitter tip function as the electrically addressable gate electrode or control grid for the individual electron emitters.

The design of these emitter structures are very critical to the performance of the flat panel FED and are best understood by reference to the prior art depicted schematically in cross sectional view, in FIG. 1. A more detailed description is provide by C. A. Sprindt in U.S. Pat. No. 5,064,396, but briefly, the method is a follows. An array of parallel lower electrodes 14 are formed on a insulating baseplate 18. An insulating layer 16 is deposited over the electrodes 14 and then a second array of upper electrodes 12 are formed perpendicular to the first array of electrodes 14 over the insulating layer 16. Circular openings 20 are formed in the upper electrodes 12 and the insulating layer 16 over and to the lower electrodes 14. Not shown in FIG. 1, a conducting material is deposited next by physical evaporative deposition normal to the surface, while the overall structure is rotated about an axis normal to the electrodes 12 and 14. Prior to the physical evaporative deposition step, a release layer, such as aluminum oxide is deposited (not shown) for lifting off the conductive layer over the upper electrode 12. During the physical evaporative deposition of the conductive layer, as shown in FIG. 1, conical electron emitter structures 26, are formed in the openings, such as opening 20 in FIG. 1, on the lower electrode 14. The conical shape results from the continuous reduction in the opening 21 of electrode 12 by the accumulation of the conductive layer on the upper electrode during the deposition process. The final electron emitting cathode structure formed by the lower and upper electrodes 14 and 12 and the emitter 26 is shown in FIG. 1 after the conductive layer is lifted off by etching the release layer.

The design of the electron emitting cathode for optimum efficiency is dependent on several process design parameters. For example, as is well known in electro-statics, the tip 28 of the conical emitter 26 should have the smallest radius of curvature, be essentially coplanar and symmetrically center in the upper electrode opening 20 and be as close to the edge of electrode 12 as is physically possible without shorting. This is to provide the highest electron emission efficiency, which is a function of the electric field E at the tip and proportional to the voltage difference between the emitter tip 28 and the upper electrode 12 and inversely proportional to the spacing R, as shown in FIG. 1. Another important design consideration is to make the distributive capacitance between the lower cathode electrode 14 and the grid or upper gate electrode 12 as small as possible The reduced capacitance minimize the RC time constant and thereby maximizes the AC circuit performance during the continuous pulse mode operation of the circuit.

Unfortunately, the nature of the deposition process for forming the conical electron emitter 26 requires that the diameter D of the opening in electrode 12 be about equal to the height H between the electrodes 12 and 14 (aspect ratio (H/D)=1.0) if the emitter tip 28 is to be coplanar with electrode 12. This results in a relatively large and undesirable distance R, as shown in FIG. 1. If the diameter of the opening 20 is decreased, then the spacing H must also be reduced to retain an aspect ratio of 1.0 and coplanarity, and this results in increased capacitance.

One invention which discloses a method for reducing the capacitance is by S. H. Holmberg, in U.S. Pat. No. 5,075,591 which forms a conical electron emitter that is coplanar with the gate electrode. A cross sectional view is schematically shown in FIG. 2 of this cathode structure. The method involves using two dissimilar dielectric layers 32 and 34 between the lower electrode 28 and the upper electrodes 30 and then using additional masking and etching steps to from a larger opening 38 and a smaller opening 36 in the dielectric layers 34 and 32, respectively. The conical emitter 29, coplanar with the upper gate electrode 30, is formed in the smaller opening 36 on the lower cathode electrode 28 which is itself supported by an insulating substrate 26. The capacitance is thereby reduced in areas having the thicker overlapping layers 32 and 34, however, the method requires additional masking and etching processing steps.

Another approach for reducing the capacitance and/or reducing the distance or gap R between the emitter tip and the upper gate electrode is also described in U.S. Pat. No. 5,064,396 by C. A. Spindt. The method is depicted in FIG. 3, and involves increasing the dielectric layer 16 to reduce the capacitance, or alternatively decreasing the diameter D of the opening 20 so that the aspect ratio is greater than 1.0 For example, the aspect ratio can have a value of about 2.0. Then the electron emitter 26 is formed as before by physical evaporative deposition. However, since the aspect ratio (H/D) of the opening is greater than 1.0, the height of the electron emitter 26 is less than the thickness of the dielectric layer 16 and therefore noncoplanar with the upper electrode 12. The improved Spindt invention utilizes two or more evaporative depositions and lift-offs to form an extension 44 on the electron emitter 26, so as to make the tip coplanar with electrode 12.

Although the above described methods of the prior art reduce the distributed capacitance while maintaining a narrow gap between the emitter tip and gate electrode, and thereby improve the circuit performance, the processing is more complex and therefore the manufacturing process is less cost effective and more susceptible to process yield loss.

SUMMARY OF THE INVENTION

It is a principle object of this invention to provide a new and improved method for manufacturing a gated self-aligned field emitter structure on a cathode with reduced capacitance between the cathode and control gate (grid) electrode.

It is another objective of this invention to form a high aspect ratio gated field emitter structure which has an electron emitter tip that is coplanar with, and self-aligned to the gate electrode.

It is still another object of this invention to provide this new and improved self-aligned gated field emitter structure without increasing the manufacturing process complexity.

In accordance with the present invention, a method is described for fabricating an array of gated field emitters with high aspect-ratios on a substrate having an array of electrically addressable cathodes. The process starts by providing an insulating substrate on which a first electrically conducting layer is deposited. The first conducting layer is patterned in a first direction to form a parallel array of first conducting strips, thereby forming electrically addressable cathodes. A blanket insulating layer is deposited over the first conducting strips having a thickness equal to the height of the high aspect ratio gated field emitters that are later formed by the method of this invention. A second electrically conducting layer is deposited on the insulating layer and patterned to form a second parallel array of conducting strips formed in a second direction that are orthogonal to the array of first conducting strips, thereby forming an array of electrically addressable gate electrodes, frequently referred to as control grid in the literature. Using a patterned photoresist mask, circular openings are etched in the second conducting strips in areas where the second conducting strips pass over the first conductive strips. The insulating layer is then etched in the openings to the first conducting strips and also recessed under the first conductive strips. The photoresist mask is removed and an expendable masking layer, serving as a release layer, is deposited on the substrate surface and in the openings on the sidewalls of the second conducting strips. The shallow deposition angle is used to form release layer so as to avoid depositing the layer on the first conducting layer that is exposed in the openings or on the sidewall of the insulating layer.

Now very important to this invention, the substrate is heated in a physical evaporation system under vacuum, and a third conductive layer is evaporated at normal incidence on the heated substrate. The substrate heating modifies significantly the deposition characteristics resulting in an increased aspect ratios for the gated field emitters that are formed on the first conducting strips (cathode electrodes) in the openings. The higher the substrate temperature during deposition the larger the aspect ratio. The release layer is then etched, lifting off the third conducting layer elsewhere on the substrate and thereby completing the array of high aspect-ratio gated field emitter structures. The gated field emitters are self-aligned to the circular openings in the gate electrodes, and are coplanar and in close proximity to the edge of the gate electrodes in the opening.

It should be noted that the insulating layer between the cathode and gate electrodes is increased in thickness to provide the correct height so that the top of the high aspect-ratio gated field emitter structure is coplanar with the gate electrode. This substantially reduces the capacitance between electrodes and improves the AC performance between the cathode and gated electrodes.

BRIEF DESCRIPTION OF THE DRAWINGS

The invention is described in more detail in the preferred embodiment with reference to the attached drawings that include:

FIGS. 1 through 3 showing a schematic cross sectional views of micro-miniature gated field emitter for the prior art greatly enlarged.

FIGS. 4 through 8 showing a schematic cross sectional view of a gated field emitter for the fabrication steps of a first embodiment of this invention, having a conical field emitter structure with an increased aspect-ratio.

DESCRIPTION OF THE PREFERRED EMBODIMENTS

Figure 5:
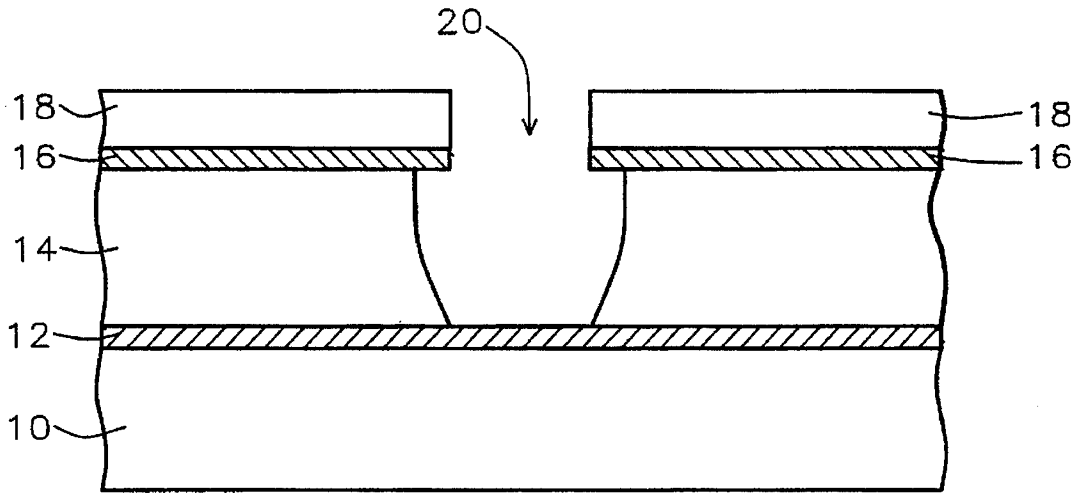

Referring now to FIGS. 4 through 8 the detailed method of fabricating a self-aligned gated field emitter is described. Although only one gated field emitter is depicted in the FIGS., it should be well understood by those skilled in the art that an array of field emitters are usually formed simultaneously on the cathode to effectively build a flat-panel Field Emission Display (FED).

The first series of fabrication steps are shown, in FIG. 4, starting with a supporting structure or backing plate, here after referred to as substrate 10. The substrate 10 can be composed of any suitable crystalline, polycrystalline or amorphous material and, more specifically, the substrate can be composed of a dielectric material, such as silicon dioxide, or alternatively, the substrate can be composed of a conductor or semiconductor with an insulating layer formed thereon. For the purpose of this invention the substrate 10 is assumed to be a dielectric material.

Still referring to FIG. 4, a first conducting layer 12 is deposited on the insulating substrate 10. The conducting layer 12 can be composed of a doped polysilicon, a refractory metal silicide or a metal, such as molybdenum. The layer can be formed by chemical vapor deposition (CVD), sputter deposition and/or physical evaporation. The material of choice for the first conducting layer 12 is preferably molybdenum (Mo) having a thickness of between about 2000 to 6000 Angstroms. Alternatively, niobium (Nb) can also be used for layer 12.

The first conductive layer 12 is patterned using photolithographic techniques and etching to form an array of first conducting strips that serve as the cathode electrodes for the array of high aspect-ratio gated field emitters that are later formed thereon. The preferred etch for patterning layer 12 is an anisotropic etch in a plasma etcher using, for example, a reactive etch gas such as carbon tetraflouride ($CF_4$), chlorine ($Cl_2$) or carbon tetrachloride ($CCl_4$). A cross section through a portion of one of the conducting strips and also labeled 12 is shown in FIG. 4.

A blanket insulating layer 14, for example, composed of silicon oxide, is then deposited over the array of first conducting strips 12 on substrate 10, as is also shown in FIG. 4. The silicon oxide layer 14 can be deposited, for example, by low pressure chemical vapor deposition (LPCVD) using a reactant gas such as tetraetheloxysilane (TEOS) or alternatively, can be deposited by sputter deposition from a silicon oxide target. Because layer 14 serves as the insulation layer between the cathode and gate electrodes, it is very important that layer 14 have a high dielectric strength to withstand the voltage difference impressed between the electrodes. It is also important that the insulator have a low dielectric constant, so as to provide the lowest capacitance. Another important process parameter is the thickness of the silicon oxide, and as will become clear later, the oxide thickness is further increased by the method of this invention which provide a high aspect ratio field emitter and thereby reduces the RC time constant of the circuit and improves the circuit performance.

Still referring to FIG. 4, a second conducting layer 16 is deposited on the insulating layer 14. The layer 16 can be formed by methods similar to depositing the first conductive layer. Layer 16 is also preferably composed of molybdenum (Mo) having a thickness of between about 2000 to 6000 Angstroms, and alternatively, niobium (Nb) can be used in place of Mo. Using photolithographic techniques and etching the second conducting layer 16 is then patterned forming array of second conducting strips in a second direction which is orthogonal to the array of first conducting strips 12. A portion of the second conducting strip is also shown in FIG. 4 and also labeled 16. The second conducting strips serve as gate electrodes or control grid electrodes, as is frequently referred to in the literature.

Opening 20, as shown in FIG. 4, are formed in the second conducing strips 16 in regions where the second conducing strips 16 cross over the first conducting strips 12 and at the location where the gated field emission structures are to be formed. The openings are preferably circular in shape and are formed using a patterned photoresist mask 18 and etching. For example, if the second conducting layer 16 is composed of a refractory metal or metal silicide, then the etching can be accomplished in a plasma etcher using gas mixtures containing $CF_4$, $Cl_2$ or $CCl_4$ to name a few.

Now referring to FIG. 5, with the photoresist mask still in place, the underlying insulating layer 14, composed for example of silicon oxide ($SiO_2$), is etched in the openings 20 to the top surface of the first conducting strips 12 The insulator can be isotropically etched using a wet etch or alternatively, an anisotropic plasma etch can be used, and then a wet etch or isotropic plasma etch can be used to control the recess in the insulating layer in the opening 20 under layer 16, as shown in FIG. 5. The latter approach is desirable when a multiplicity of closely spaced field emitter are required. The resulting overhang of layer 16 is important because it separates the field emitter cone structure, in the subsequent deposition, from the field emitter material elsewhere on the substrate, as will become apparent later.

Figure 6:
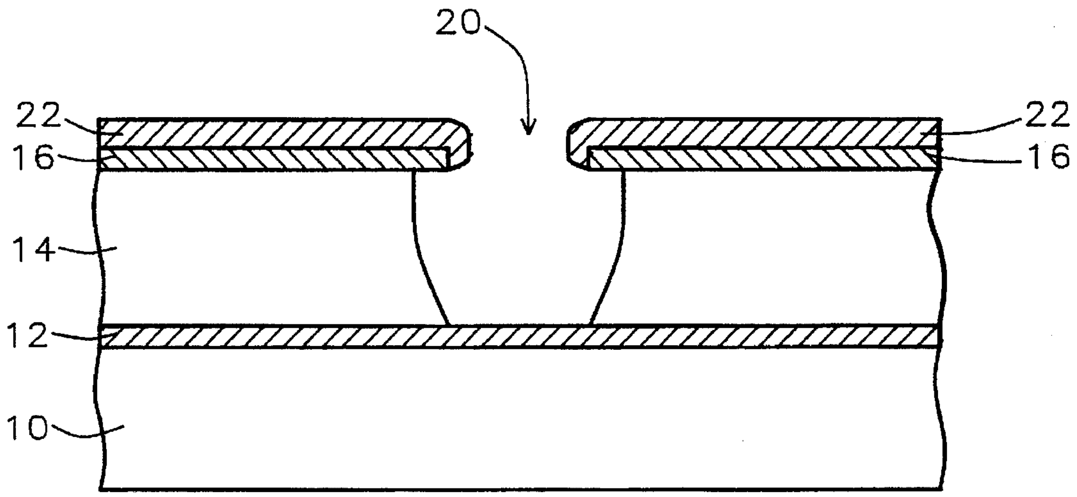

Referring now to FIG. 6, the photoresist mask 18 is removed by conventional means and an expendable release layer 22, composed of aluminium (Al) or nickel (Ni) is deposited on the substrate at a shallow angle to the substrate surface while rotating the substrate about an axis normal to the surface. The sidewalls of layer 16 and the substrate surface are coated while the shallow angle ensures that the sidewalls of layer 14 and the exposed surface of the first conducting strips 12 are free from deposition. The preferred method for depositing the aluminium or nickel is by physical evaporation and the preferred thickness is between about 3000 to 8000 Angstroms. The deposition angle with respect to the substrate surface is preferably between about 10 to 50 Degrees. This layer is used later as a release layer to lift off the unwanted emitter material after the field emitter cones are formed.

Now, very important to this invention and prior to deposition of the gated field emitter material, the substrate is heated in the physical evaporation system under high vacuum ( about 5 E–7 torr) to an elevated temperature to achieve the high aspect ratio emitter. By way of example, if the substrate is heated to a temperature between about 150° to 300° C., then the field emitter structure will have an aspect-ratio of between about 1.4 to 3.0. This is substantially higher than the aspect-ratio 1.0 achieved by the more conventional methods of the prior art.

Figure 7:
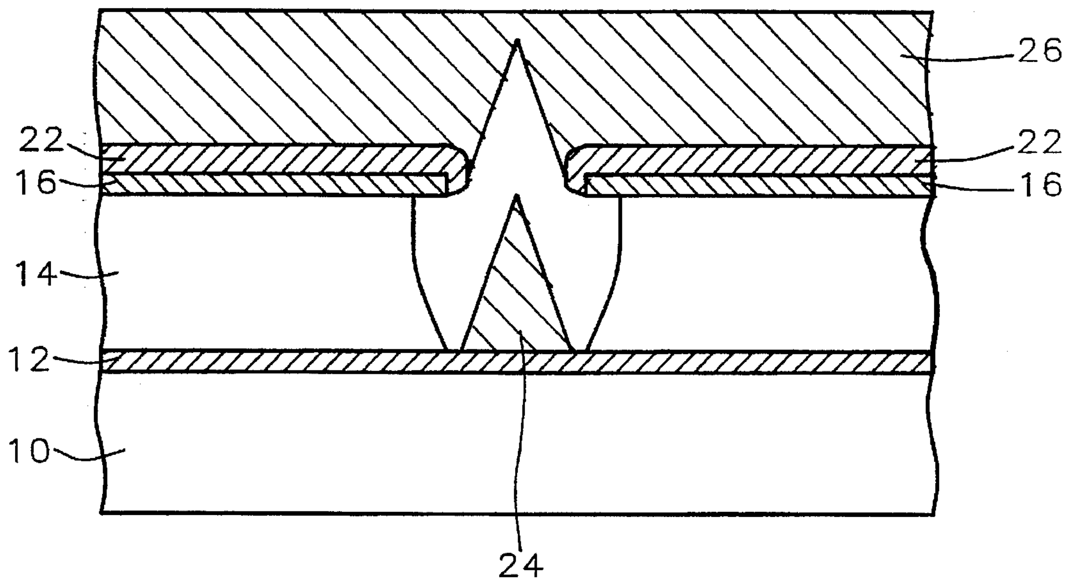

Conical emitter structures 24 are now formed by depositing a third conductive layer 26, as shown in FIG. 7. The layer 26 is preferred composed of molybdenum (Mo), metal, however, other appropriate electrically conducting materials can also be used, preferably having a high melting point temperature to withstand the current flow during electron emission, and a low work function to maximize the electron emission from the emitter. For example, some other appropriate conducting materials that can be used for the field emitter include tungsten (W), hafnium (Hf) or other similar metals having high melting point temperatures. Also, appropriate for field emitters are low work function metals and alloys, such as titanium (Ti) and lanthanum hexaboride ($LaB_6$)

The deposition of layer 26 is carried out in the physical evaporation system using, for example, a resistive-heating or electron beam evaporation source. The deposition is performed normal to the substrate surface and the heated substrate is rotated about an axis normal to the substrate surface. As shown in FIG. 7 the deposition is continued until the circular opening 20 is completely covered by layer 26. Because of the shadowing effect of the overhanging edge of layers 16 and 22, a self-aligned cone shaped field emitter structure 24 is formed in opening 20 on the cathode strip 12 and separated by the shadowing effect from the deposited layer 26.

Figure 8:
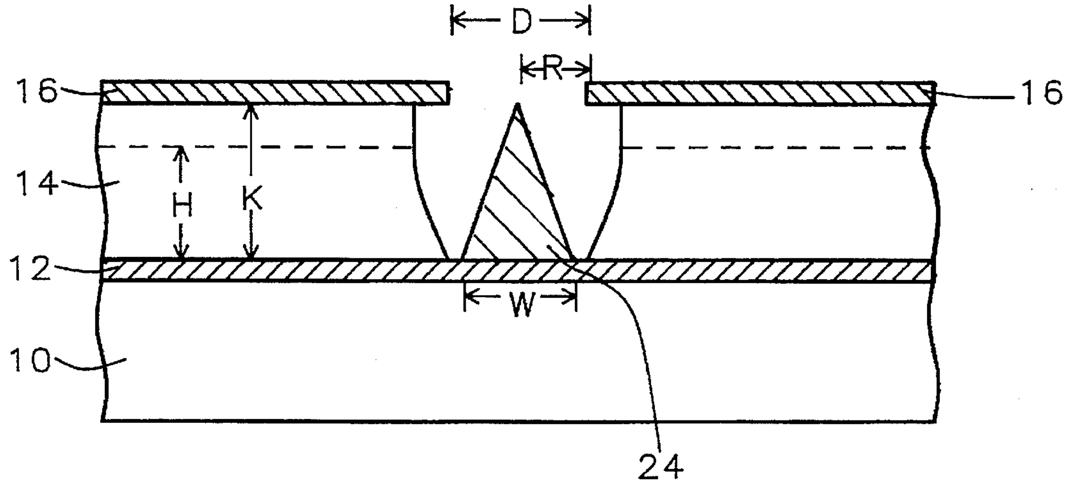

Referring now to FIG. 8, the array of self-aligned high aspect-ratio gated field emitters are completed by etching the aluminium release layer 22, for example, in a solution of hydrochloric acid. Alternatively, if nickel is used as the lift-off layer then sodium hydroxide is used to remove the layer 22, and thereby lifting off the layer 26 leaving remaining the self-aligned cone shaped field emitters structure 24.

To better understand the invention several points about the process should be addressed. For example, the aspect-ratio of field emitter 24, defined as the ratio of the emitter height K to the emitter width W, as shown in FIG. 8, is determined by the deposition temperature of layer 26 of this invention. By way of example, if the temperature is about 150° C. then the aspect-ratio is about 1.4. and there is a 40 percent increase in emitter height over the conventional method of deposition which as an aspect-ratio of only 1.0 and an emitter height H. The height K of emitter 24 is equal to the width W times the aspect-ratio, therefore the emitter is increased in height by about 40 percent. The absolute height of the emitter depends on the width W of the emitter which is itself a function of the opening 20, as shown in FIG. 6. Since the tip of the emitter should be coplanar with the gate electrode 16, it is very important to provide an insulating layer 14 of the correct thickness, which would be about 40 percent thicker and equal to K rather than the conventional method which is only equal to H. This then reduces the capacitance by 29 percent and significantly improves circuit performance.

A second point to be made is that the exact thickness of the third conducting layer 26 is not critical, but should be of sufficient thickness to cover the opening 20 as shown in FIG. 7. Therefore, there is a critical lower limit to the thickness of layer 26 and is set at a thickness that is greater than the emitter height K or, equivalently, equal to the insulator thickness also K.

Figure 9:
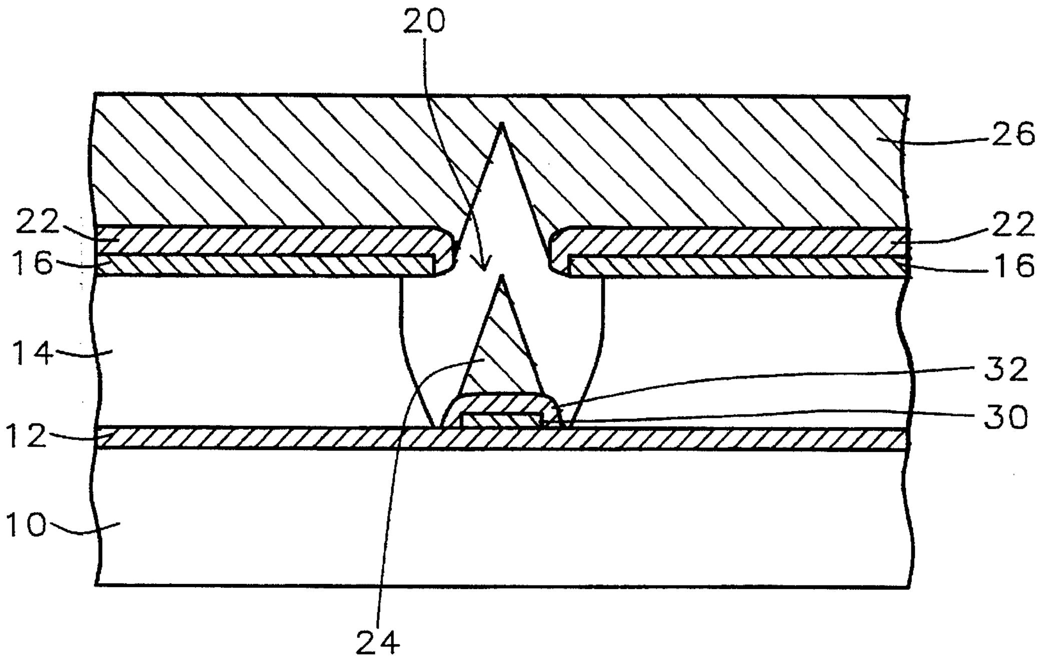
FIGS. 9 and 10 showing a schematic cross sectional view of a gated field emitter for the fabrication steps of a second embodiment of this invention, having a conical shaped field emitter having an increased aspect-ratio and built on a conducting pedestal to further increase the cathode to gate electrode spacing.
Figure 10:
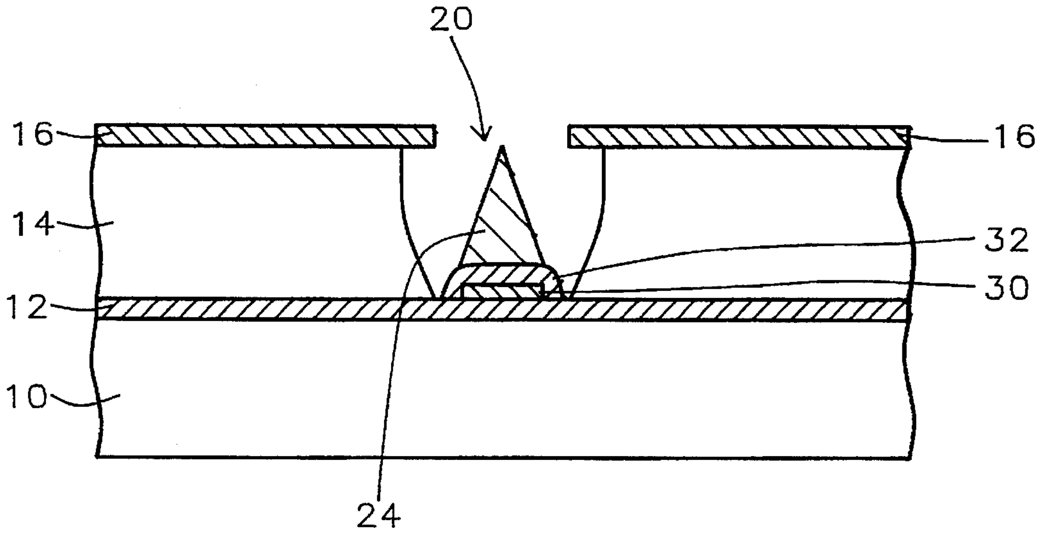

Referring now more specifically to FIGS. 9 and 10, a second embodiment is described for making high aspect ratio gate field emitters having thereunder pedestals so as to further increase the insulating layer 14 between the cathode 12 and gate 16 electrodes and further improve the circuit performance. This second embodiment is the same as the first embodiment up to and including the formation of the release layer 22. Therefore, the FIGS. 4 through and including FIG. 6 are the same and the numbering in the Figs. are also the same.

Referring now to FIG. 9, a second embodiment is depicted and starts by forming an electrically conducting pedestal on the first conducting strip 12 in the opening 20. This essentially increases or raises the height of the gated field emitter structures 24. A thicker insulating layer 14 is also required to provide a gate electrode 16 that remains coplanar with the tip of the field emitter 24, and thereby the increase in layer 14 decreases the capacitance between the electrodes and improves in circuit performance.

The method involves depositing two addition metal layers which are here referred to as the first pedestal layers 30 and second pedestal layer 32. The layers 30 and 32 are deposited in opening 20 of FIG. 6. The method involves depositing, depicted in FIG. 9, a first pedestal layer 30 composed of titanium (Ti) and is deposited on the rotating heated substrate in a evaporator in a direction normal to the substrate surface. The thickness of the first pedestal layer 30 is between about 300 to 2000 Angstroms. As shown in FIG. 9 a portion of layer 30 forms a pedestals on first conducting strip 12 (cathode) in opening 20. The Ti pedestal is about equal in diameter to the opening 20. The second pedestal layer 32 is composed of molybdenum (Mo) and is deposited at an angle of about 10 to 30 degrees with respect to the substrate surface and has a thickness of about between 1000 to 5000 Angstroms. This results in the completion of the pedestal having a larger diameter portion of layer 32 being formed over and protecting the Ti pedestal. Alternatively the Ti layer 30 can be replaced with a chromium (Cr) or aluminum (Al) layer and the molybdenum layer 32 can be replaced by tungsten (W) or tungsten/titanium (WTi) alloy.

Still referring to FIG. 9, the third conducting layer 26 is deposited by the method of the first embodiment to form the high aspect-ratio emitter 24 on the pedestal layer 32. The third conductive layer 26 is then removed elsewhere on the substrate using the release layer 22 by the method of the first embodiment to complete the array of gated field emitters 24, as shown in FIG. 10. The total thickness of the pedestal layers increases the high of the high aspect-ratio field emitter to about 3000 to 5000 Angstroms, thus allowing the insulating layer 14 to be increased further, and thereby further improve the circuit performance.

While the invention has been particularly shown and described with reference to the preferred embodiments thereof, it will be understood by those skilled in the art that various changes in form and details may be made without departing from the spirit and scope of the invention.

What is claimed is:

1. A method for fabricating an array of gated field emitter structures having high aspect ratios on an insulating substrate comprising the steps of:

providing an insulating substrate;

depositing a first electrically conducting layer on said insulating substrate;

patterning said first electrically conducting layer by photoresist masking and etching and thereby forming cathodes comprising of an array of parallel first conducting strips in a first direction on said substrate;

depositing a blanket insulating layer on said first conducting strips and elsewhere on said substrate;

depositing a second electrically conducting layer on said insulating layer;

patterning said second electrically conducting layer by photoresist masking and etching and thereby forming a gate electrode comprising of an array of parallel second conducting strips in a second direction that cross over said array of parallel first conducting strips;

forming openings in said second conducting strips to said insulating layer over portions of said first conducting strips by photoresist masking and etching; and etching said insulating layer in said openings to said first conducting strips and recessing the sidewalls of said insulating layer in said openings and under said second conducting strips;

removing said photoresist mask;

depositing a release layer at a shallow angle on said insulating substrate while rotating said substrate about an axis normal to said substrate surface, and thereby forming said release layer on said substrate surface and on sidewalls of said openings in said second conducting strips;

heating said insulating substrate in an evacuated evaporation system prior to depositing a third conducting layer for the purpose of forming said electron field emitter structures having high aspect ratios;

depositing a third conducting layer at normal incidence on said heated substrate surface, and thereby forming in said openings on said first conducting strips said array of high aspect ratio gated field emitter structures and said third conducting layer deposited elsewhere on said substrate and physically separated from said array of field emitter structures;

etching said release layer and lifting off said third conducting layer elsewhere on said substrate, and thereby completing said array of high aspect ratio gate field emitter structures on said array of cathode electrodes, and furthermore having an array of gate electrodes with openings that are self-aligned, coplanar and in close proximity to the tips of said gated field emitters.

2. The method of claim 1, wherein said first electrically conducting layer is composed of molybdenum (Mo) and has a thickness of between about 2000 to 6000 Angstroms.

3. The method of claim 1, wherein said insulating layer is composed of silicon oxide (SiO2) and has a thickness that is equal to the height of said high aspect-ratio field emitter structure.

4. The method of claim 1, wherein said second electrically conducting layer is composed of molybdenum (Mo) and has a thickness of between about 2000 to 6000 Angstroms.

5. The method of claim 1, wherein said opening in said second conducting strips are circular in shape.

6. The method of claim 1, wherein said insulating layer in said openings is recessed under said second conducting strips by between about 0.3 to 1.5 micrometers.

7. The method of claim 1, wherein said release layer is composed of aluminum (Al) and is deposited at an angle of between about 10 to 50 Degrees with respect to said substrate surface.

8. The method of claim 7, wherein the thickness of said release layer is between about 3000 to 8000 Angstroms.

9. The method of claim 1, wherein said third conducting layer is deposited to thickness greater than the height of said insulating layer by between about 30 to 100 percent.

10. The method of claim 1, wherein the aspect-ratio (height to base width ratio) of said field emitters increases with temperature of said substrate.

11. The method of claim 10, wherein the aspect-ratio of said field emitters vary between about 1.4 to 3.0 for a substrate temperature between about 100° to 300° C.

12. The method of claim 10, wherein the base width of said field emitters are about equal to the diameter of said openings in said second conducting strips after deposition of said release layer.

13. A method for fabricating an array of gated field emitter structures having high aspect ratios and pedestals on an insulating substrate comprising the steps of:

providing an insulating substrate;

depositing a first electrically conducting layer on said insulating substrate;

patterning said first electrically conducting layer by photoresist masking and etching and thereby forming cathodes comprising of an array of parallel first conducting strips in a first direction on said substrate;

depositing a blanket insulating layer on said first conducting strips and elsewhere on said substrate;

depositing a second electrically conducting layer on said insulating layer;

patterning said second electrically conducting layer by photoresist masking and etching and thereby forming a gate electrode comprising of an array of parallel second conducting strips in a second direction that cross over said array of parallel first conducting strips;

forming openings in said second conducting strips to said insulating layer over portions of said first conducting strips by photoresist masking and etching; and etching said insulating layer in said openings to said first conducting strips and recessing the sidewalls of said insulating layer in said openings and under said second conducting strips;

removing said photoresist mask;

depositing a release layer at a shallow angle on said insulating substrate while rotating said substrate about an axis normal to said substrate surface, and thereby forming said release layer on said substrate surface and on sidewalls of said openings in said second conducting strips;

heating said insulating substrate in an evacuated evaporation system prior to depositing a first and second conducting pedestal layer and a third conducting layer for the purpose of forming said electron field emitter structures having high aspect ratios on said pedestal structure;

depositing on said substrate said first conducting pedestal layer at normal incidence to said substrate surface;

depositing on said substrate said second conducting pedestal layer at an angle to said substrate surface while rotating said substrate about an axis to said substrate surface;

depositing a third conducting layer at normal incidence on said heated substrate surface, and thereby forming in said openings on said second conducting pedestal layer said array of high aspect ratio gated field emitter structures and said first and second pedestal and third conducting layer deposited elsewhere on said substrate are physically separated from said array of pedestals with field emitter structures thereon;

etching said release layer and lifting off said first and second pedestal layer and said third conducting layer elsewhere on said substrate, and thereby completing said array of high aspect ratio gated field emitter structures having conducting pedestals on said array of cathode electrodes, and furthermore having an array of gate electrodes with openings that are self-aligned, coplanar and in close proximity to the tips of said high aspect-ratio gated field emitters.

14. The method of claim 13, wherein said first electrically conducting layer is composed of molybdenum (Mo) and has a thickness of between about 2000 to 6000 Angstroms.

15. The method of claim 14, wherein said molybdenum is replaced by nickel (Ni).

16. The method of claim 13, wherein said insulating layer is composed of silicon oxide ($SiO_2$) and has a thickness that is equal to the height of said high aspect-ratio field emitter structure on said conducting pedestal.

17. The method of claim 13, wherein said second electrically conducting layer is composed of molybdenum (Mo) and has a thickness of between about 2000 to 6000 Angstroms.

18. The method of claim 17, wherein said molybdenum is replaced by nickel (Ni).

19. The method of claim 13, wherein said opening in said second conducting strips are circular in shape.

20. The method of claim 13, wherein said insulating layer in said openings is recessed under said second conducting strips by between about 0.3 to 1.5 micrometers.

21. The method of claim 13, wherein said release layer is composed of aluminium (Al) and is deposited at an angle of between about 10 to 50 Degrees with respect to said substrate surface.

22. The method of claim 21, wherein the thickness of said release layer is between about 3000 to 8000 Angstroms.

23. The method of claim 13, wherein said third conducting layer is deposited to a thickness greater than the height of said insulating layer by between about 30 to 100 percent.

24. The method of claim 13, wherein the aspect-ratio (height to base width ratio) of said field emitters increases with temperature of said substrate.

25. The method of claim 24, wherein the aspect-ratio of said field emitters vary between about 1.4 to 3.0 for a substrate temperature between about 100° to 300° C.

26. The method of claim 24, wherein the base width of said field emitters are about equal to the diameter of said openings in said second conducting strips after deposition of said release layer.

27. The method of claim 13, wherein said first conducting pedestal layer is composed of titanium (Ti) and has a thickness of between about 300 to 2000 Angstroms.

28. The method of claim 27, wherein the titanium is replaced by chromium (Cr).

29. The method of claim 27, wherein said titanium is replaced with aluminium.

30. The method of claim 13, wherein said second conducting pedestal layer is composed of molybdenum (Mo) and is deposited at an angle of between 10 to 30 Degrees with respect to the substrate surface having a thickness of between about 1000 to 5000 Angstroms.

31. The method of claim 30 wherein said molybdenum is replaced by tungsten (W).

32. The method of claim 30, wherein said molybdenum is replaced by a tungsten (W) and titanium (Ti) alloy.

* * * * *

UNITED STATES PATENT AND TRADEMARK OFFICE

CERTIFICATE OF CORRECTION

PATENT NO. : 5,656,525

DATED : Aug. 12, 1997

INVENTOR(S) : Ching-Yuan Lin, Chao-Chi Peng, Kuan-Lun Chang, Jermmy J.M. Wang

It is certified that error appears in the above-indentified patent and that said Letters Patent is hereby corrected as shown below:

On the Cover Page, at (75), delete "Kyan-Lun Chang" and replace with --Kuan-Lun Chang--.

Signed and Sealed this

Twenty-ninth Day of December, 1998

Attest:

BRUCE LEHMAN

*Attesting Officer*

*Commissioner of Patents and Trademarks*